United States Patent [19]

Jennings

[11] Patent Number: 4,464,774

[45] Date of Patent: Aug. 7, 1984

[54] HIGH SPEED COUNTER CIRCUIT

[75] Inventor: James Jennings, Irvine, Calif.

[73] Assignee: Sperry Corporation, New York, N.Y.

[21] Appl. No.: 358,366

[22] Filed: Mar. 15, 1982

[51] Int. Cl.³ .................... H03K 21/16; H03K 23/02
[52] U.S. Cl. .................... 377/117; 377/105; 377/115; 377/116
[58] Field of Search ............... 377/115, 116, 117, 105

[56] References Cited

U.S. PATENT DOCUMENTS

| | | | |
|---|---|---|---|
| 3,354,294 | 11/1967 | Kulka | 377/115 |
| 3,906,256 | 9/1975 | Suzuki et al. | 377/105 |
| 3,943,378 | 3/1976 | Beutler | 377/117 |
| 4,037,085 | 7/1977 | Minorikawa | 377/116 |
| 4,297,591 | 10/1981 | Roesler et al. | 377/117 |
| 4,408,336 | 10/1983 | Das Gupta | 377/116 |

Primary Examiner—John S. Heyman
Assistant Examiner—N. Biase
Attorney, Agent, or Firm—John B. Sowell; Eugene T. Battjer; Marshall M. Truex

[57] ABSTRACT

There is shown and described a new and unique counter mechanism or circuit which includes feedback latches, in cascade, and which monitors a "carry-in" signal which selectively causes the latch to toggle. When the contents of the latch is a binary 1, the carry-in signal propagates through the counter as a "carry-out" signal. Counting by the circuit occurs when the count input and carry-in signals are active.

14 Claims, 6 Drawing Figures

HIGH SPEED COUNTER CIRCUIT

BACKGROUND

1. Field of the Invention

This invention is directed to counting devices, in general, and to high speed counting devices, in particular.

2. Prior Art

There are many counting circuits known in the art. These circuits are adapted to count various items, usually by means of counting pulses which are indicative of the items to be counted. The counters may operate on straight binary counting codes, Gray-codes or any other suitable code arrangement. In these known counters, the usual technique is to detect a pulse or the like to be counted and to serially operate thereon. That is, the detected pulse is added to (or subtracted from) the count which is currently extant. (Of course, in the case where the count is subtracted, the counter operates as a decrementer rather than an incrementer.)

The counters which are known in the art are of various configurations. Moreover, the counters utilize various types of logic construction techniques. Typically, the counters are formed of discrete components or integrated logic circuits but, frequently, can be modified and reduced to various types of LSI or VLSI techniques.

In many cases, the counters which are known in the art (whether incrementers or decrementers) tend to be relatively slow in operation thereby creating a certain amount of limitation on the operating speed of the overall circuit. Moreover, the propagation of the "carry-in" signal through the circuit is often-times a troublesome aspect which causes complications in the logic scheme. This is frequently the case, even in the so-called "carry-ripple" type circuits.

SUMMARY OF THE INVENTION

This invention is directed to a counter circuit which can operate as an incrementer or, with modest changes in the detailed configuration, a decrementer. The counter consists of feedback latches which can be formed of NMOS devises. The feedback latches are connected in cascade. The counter monitors the "carry-in" signal from a preceding stage (or external source) which selectively causes the feedback latch to toggle. If the contents of the latch is a binary 1 signal, the "carry-in" signal toggles the latch, propagates through the counter and appears as a "carry-out" signal.

DESCRIPTION OF A PREFERRED EMBODIMENT

Figure 1:
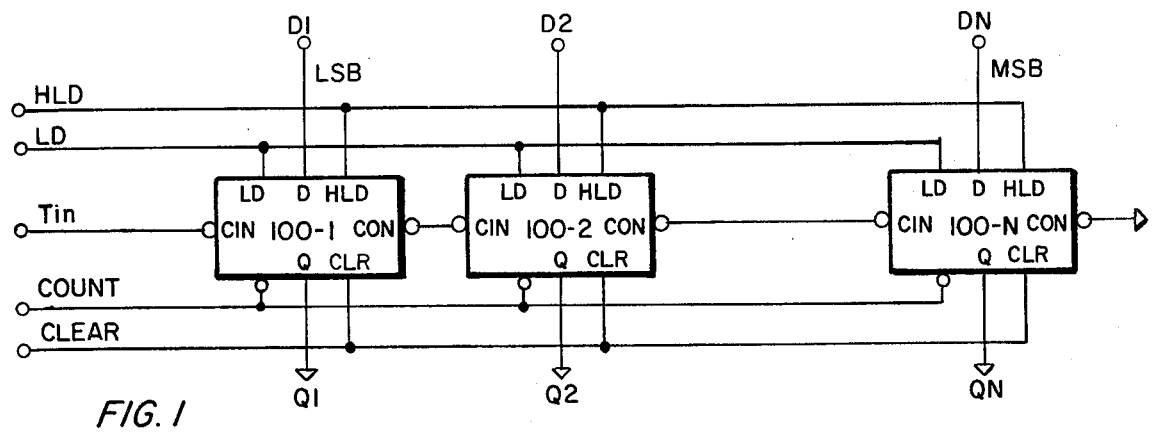
FIG. 1 is a block diagram of a counter comprising a plurality of counting cells or latches which form the instant invention.

Referring now to FIG. 1, there is shown a counter mechanism which includes a plurality of cells. The cells, which are substantially identical to each other, are referred to as cells 100-1, 100-2 through 100-N. Each of the cells has a data input terminal D1, D2 ... Dn, respectively. Likewise, each of the cells has an output terminal Q1, Q2 ... QN, respectively. The input terminals D1 through DN are provided in order that data can be selectively entered into the appropriate data cells. The output terminals Q1 through QN are provided so that count signals can be detected and retrieved form the counter mechanism. In the embodiment shown in FIG. 1, the -1 channel represents the least significant bit (LSB) while the N channel represents the most significant bit (MSB).

A hold signal (HLD) is supplied to the HLD terminal of each of the cells. Likewise, the load signal (LD) is supplied to the load terminal of each of the cells. Also, the count signal (COUNT) is supplied to each cell. A clear signal (CLR) is supplied to each of the cells, as well, in this embodiment. (The clear signal is not essential to the inventive concept, per se.)

The carry-in signal (Tin) is supplied to the carry-in terminal (CIN) of cell 100-1. The carry-out signal (Ton) is supplied at the carry-out terminal (CON) terminal of cell 100-1. Each of the cells includes a carry-in terminal and a carry-out terminal. The carry-out terminal of each cell is connected to the carry-in terminal of the succeeding cell, except for the last cell wherein the carry-out signal is not so connected.

Briefly, the signals supplied at the terminals D1 through DN are selectively loaded into the respective cells with the application of the load signal. The hold signal, which is defined to be the complement of the load and/or count signals, is arranged to selectively permit control over the internal operation of the respective cells as will be described hereinafter relative to the detailed circuits shown in FIG. 2 and/or 4.

The operation of counter circuits is well known in the art. While various codes can be used, the typical binary code pattern is shown in Table I. The code shown in Table I is directed to a 4 bit counter operation which provides 16 counts (0–15).

TABLE I

FOUR BIT COUNTER OPERATION

| Count | \ | Bit Position | \ | \ |
|---|---|---|---|---|
| | 3 | 2 | 1 | 0 (LSB) |
| 0 | 0 | 0 | 0 | 0 |
| 1 | 0 | 0 | 0 | 1* |
| | | | | ↓ |
| 2 | 0 | 0 | 1 | 0 |
| 3 | 0 | 0 | 1* | 1* |
| | | | ↓ | ↓ |
| 4 | 0 | 1 | 0 | 0 |
| 5 | 0 | 1 | 0 | 1 |
| 6 | 0 | 1 | 1 | 0 |
| 7 | 0 | 1* | 1* | 1* |
| | | ↓ | ↓ | ↓ |
| 8 | 1 | 0 | 0 | 0 |
| 9 | 1 | 0 | 0 | 1 |
| 10 | 1 | 0 | 1 | 0 |
| 11 | 1 | 0 | 1 | 1 |
| 12 | 1 | 1 | 0 | 0 |
| 13 | 1 | 1 | 0 | 1 |
| 14 | 1 | 1 | 1 | 0 |
| 15 | 1* | 1* | 1* | 1* |

It is noticed that the least significant bit (LSB) toggles on each count operation. That is, the least significant bit column is alternately 0, 1, 0, 1, and so forth. It is also observed for any count that includes all binary 1's in consecutive bit positions from the least significant bit position, on the next count the next bit position toggles on the next count operation.

Thus, the least significant bit position clearly toggles, i.e., 0, 1, 0, 1, and so forth, as shown in Table I. In like manner, at count 1, all of the bit positions (starting from the least significant bit position) are 1's. Consequently, going from count 1 to count 2, the next bit position in line also toggles along with the LSB. In regard to counts 1 and 2 a nearly trivial situation occurs in that only the least significant bit position is involved and it contains a 1. Consequently, at count 2 the least significant bit position toggles and, as well, the next bit position also toggles from 0 to 1.

At count 3, the least significant bit position and the next least significant bit position are both 1. Consequently, at count 4, the least significant bit positions both toggle and the next bit position also toggles.

A similar situation obtains relative to counts 7 and 8 and counts 15 and the rollover count zero.

In making use of this observation, the instant circuit is useful in causing the least significant bit conditions to be supplied to the next position and, thereby, speed up the operation of the counter.

Figure 2:
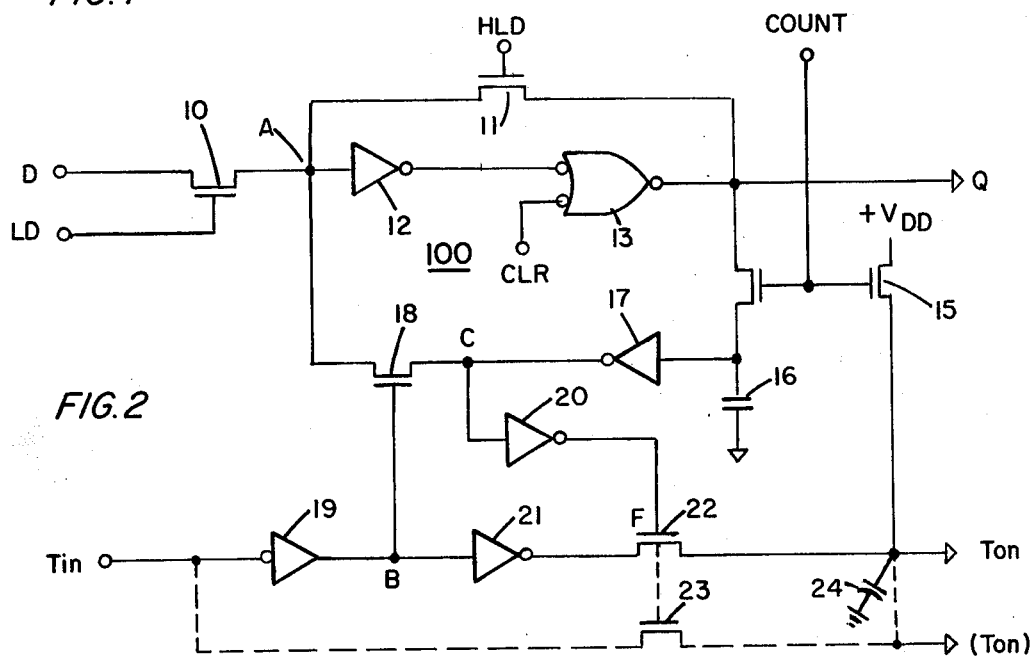
FIG. 2 is a schematic diagram of the circuitry of an incrementing counter cell.

Referring now to FIG. 2, there is shown a detailed circuit diagram of a typical cell 100. More particularly, the circuit shown in FIG. 2 is an incrementer circuit. In this circuit diagram, elements and components which are similar to those shown in FIG. 1 are similarly numbered or labeled. For example, the data input terminal is identified by the reference character D, and so forth.

The circuit comprises an input control device 10 which can take the form of a transistor or the like. Of course, in LSI applications a suitable control junction is provided. In particular, the control electrode of transistor 10 is connected to the load (LD) input while one side of the conduction path is connected to the data (D) input terminal. The other end of the conduction path of transistor 10 is connected to the input terminal of inverter 12 at node A. The output terminal of inverter 12 is connected to one input of NOR gate 13. The other input terminal of NOR gate 13 is connected to the clear (CLR) input terminal. The output terminal of NOR gate 13 is connected to the Q output terminal. In addition, the output terminal of NOR gate 13 is connected to the input terminal of inverter 12 via the conduction path of transistor 11 (which may be of a type similar to transistor 10). The control electrode of transistor 11 is connected to the hold (HLD) input terminal.

The output terminal of NOR gate 13 is also connected to one side of the conduction path of transistor 14. The other side of the conduction path of transistor 14 is connected to the input terminal of inverter 17 and to one side of capacitor 16. The other side of capacitor 16 is connected to ground. This capacitor may be a discrete capacitor or it may be an inherent capacitor which stores charge at the circuit point shown when the circuit is constructed by LSI techniques.

The output terminal of inverter 17 is connected to one side of the conduction path of transistor 18 and to the input terminal of inverter 20 at node C. The other side of transistor 18 is connected to the input terminal of inverter 12. The output terminal of inverter 20 is connected to the control electrode of transistor 22 at node F. One side of the conduction path of transistor 22 is connected to the output terminal of inverter 21. The input terminal of inverter 21 is connected to the output terminal of inverter 19 and to the control electrode of transistor 18 at node B. The input terminal of inverter 19 is connected to the Tin input terminal.

Returning to transistor 22, the other side of the conduction path is connected to the Ton output terminal as is one side of the conduction of precharge transistor 15. This junction is also connected to capacitor 24 which can be similar to capacitor 16 described above. The other side of the conduction path of transistor 15 is connected to $+V_{DD}$. The control electrodes of transistors 14 and 15 are connected to the COUNT input terminal.

Also shown in dashed outline, is transistor 23 which has the conduction path thereof connected between the Tin input terminal and the Ton output terminal. The control electrode of transistor 23 is connected to the output of inverter 20.

It should be noted that transistor 23 and the accompanying circuitry, shown in dashed outline, is used when driving a relatively light load. That is, when the load is sufficiently small that the input signal supplied at the Tin circuit electrode is satisfactory for circuit operation. In the event that the output load is too large to permit the input signal to properly function, the driver inverter 21 is utilized as shown in solid line.

Figure 3:
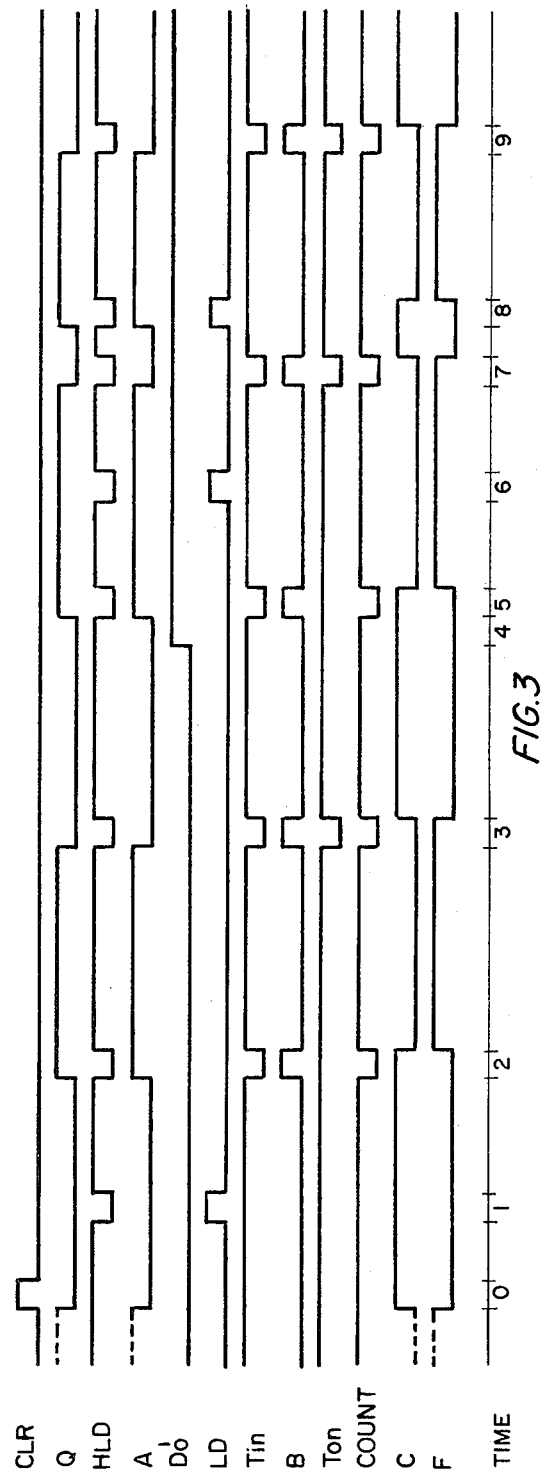
FIG. 3 is a timing diagram of the operation of the circuit shown in FIG. 2.

In describing the operation of the incrementer circuit shown in FIG. 2, concurrent reference is made to FIGS. 2 and 3. Note that signals of FIG. 3 are identified by the same reference character as the appropriate node. As noted above, the circuit can be cleared by supplying the clear (CLR) signal to NOR gate 13 as shown at T0 in FIG. 3. Alternatively, NOR gate 13 can be replaced by a simple inverter and a binary zero signal can be supplied to the circuit during a load operation as shown at T1. Typically, the circuit is initialized by storing all zeroes therein. However, other signal combinations are permissible.

Assume that the circuit has been cleared by supplying the clear signal at T0. The output signal Q is then set to zero. This zero signal at output terminal Q is fed back to the input terminal A of inverter 12 via feedback transistor 11 which is maintained in the on or conductive condition by the application of a high level hold signal (HLD). Thus, inverter 12 and NOR gate 13 (or appropriate inverter) form a static flip-flop circuit.

At the same time, the COUNT signal and the carry-in signal (Tin) are both high level signals. In fact, each of these signals can be supplied from the same source. The high level count signal causes transistors 14 and 15 to be conductive while the high level carry-in signal is inverted as shown at terminal B and causes transistor 18 to be nonconductive. Consequently, the output signals produced by inverters 20 and 21 are at the same levels at the signals Q and Tin, respectively. Under the conditions described, a low level signal F is supplied and renders transistor 22 nonconductive. However, the high level COUNT signal renders the precharge transistor 15 operative which thereby connects the output terminal Ton to the $+V_{DD}$ terminal thereby storing charge in capacitor 24 at the output terminal Ton.

At time period T1, a load operation is initiated by the application of the load signal (LD). At this time, the hold signal (HLD) is also switched to the low level. The hold signal, when switched low, has the effect of disabling transistor 11 wherein the feedback loop of the static flip-flop is opened. Thus, a signal can be loaded into the flip-flop without immediately propagating back to input terminal A.

In the illustrative description, the load operation of time period T1 is directed to loading a zero input signal at the data terminal D. The zero is supplied to terminal A, inverted by inverter 12, reinverted by gate 13 and supplied as a zero or low level output signal at terminal Q. It will be ssen that no changes are effected by this operation.

Assuming now that a count or increment operation is desired, the COUNT and increment (Tin) signals are switched from the high level to the low level as shown at time period T2. In addition, the hold signal (HLD) also switches low to break the feedback path of the flip-flop. With the application of the COUNT signal, transistors 14 and 15 are rendered nonconductive. However, the charge remains stored at the input terminal of inverter 17 (in inherent capacitance 16) and at the output terminal Ton (in inherent capacitor 24). Likewise, the Tin signal has gone low and is inverted by inverter 19 as a high level signal B which is supplied to transistor 18. This signal renders transistor 18 conductive so that the high level signal C is transmitted therethrough to terminal A at the input of inverter 12. It should be noted that transistor 10 is inactive because the load signal is low.

The application of the high level signal C to the input terminal of inverter 12 is immediately propagated therethrough, and, with the double inversion, produces a high level or binary one signal at output terminal Q. At the same time, the C signal is inverted by inverter 20 and produces a low level signal at transistor 22 which is, therefore, rendered nonconductive. Consequently, the double inverted low level signal Tin is not transmitted through transistor 22 and the output signal Ton remains in the high condition.

With the termination of the COUNT signal, transistors 14 and 15 are rendered conductive. Thus, the high level Q signal is supplied to the input terminal of inverter 17 and charge is stored on capacitor 16. Inverter 17 produces the low level signal C which is reinverted by inverter 20 and produces a high level signal F such that transistor 22 is now rendered conductive. At the same time, the Ton signal is reverted to the high level and a high level signal is produced on output terminal Ton. Thus, the Q output signal has switched states, which is expected when the counter is incremented by 1.

At time period T3, another increment or counting operation is initiated. That is, the COUNT and Tin signals are supplied with the same effect noted above. That is, transistors 14 and 15 are rendered nonconductive while transistor 18 is rendered conductive. In this case, a binary 1 has been stored in capacitor 16 so that output signal C from inverter 17 is a low level signal which is supplied to terminal A via transistor 18. This low level signal at node A is immediately propagated through the inverter circuits 12 and 13 to produce a low level Q output signal.

At the same time, the signal C is inverted by inverter 20 and produces a high level output signal D which is supplied to transistor 22 and renders that transistor conductive. Thus, the low level Tin signal is propagated through transistor 22 and appears as a low level signal at output terminal Ton. In this embodiment, the low level true condition exists. Therefore, a binary 1 is produced at output terminal Ton.

At the termination of the signal Tin, the Q output signal is returned to node A at the input of inverter 12 via feedback transistor 11 which is now rendered conductive. Also, the low level Q signal is transferred to the input of inverter 17 and, effectively, stored in capacitor 16. The high level signal at node C is inverted and produces a low level signal D at transistor 22 which is, therefore, turned off. However, terminal Ton is charged up to the high level via transistor 15.

At time period T4, the data signal D switches from the zero level to the one level. However, in the absence of a load signal, the circuit 100 remains essentially static.

At time period T5, another increment or count signal is supplied as was the case in time period T2. The circuit operates in the same fashion wherein counting or incrementing occurs.

At time period T6, a load signal (LD) is supplied (along with the hold signal). This load signal is operative to render transistor gate 10 conductive. Thus, a binary 1 is loaded into the cell. However, the cell already stores a binary 1 wherein the data to be inserted from the external source is not effective to alter the status of the circuit.

At time period T7, another count operation is begun by the application of the COUNT, the Tin and the HLD signals. This operation is similar to the operation at time period T3 wherein the output signal Q is switched to the low level signal.

At time period T8, another load operation is initiated by application of the load signal to transistor 10. Again, the high level input signal D is transferred to node A of the basic flip-flop. Inasmuch as the hold signal has been switched to the low level and transistor 11 is inactive, there is no feedback from inverter 13. Consequently, the high level signal at node A is immediately propagated through inverters 12 and 13 and and appears as a high level signal at terminal Q. Thus, the circuit has previously been set at a binary zero through ordinary counting. However, through the operation of an external control, the count is switched to a binary 1.

With the application of the next count or increment signal at time period T9, the operation is as occurred in time period T3, for example, and the circuit is switched to produce a binary zero output at the Q terminal.

Figure 4:
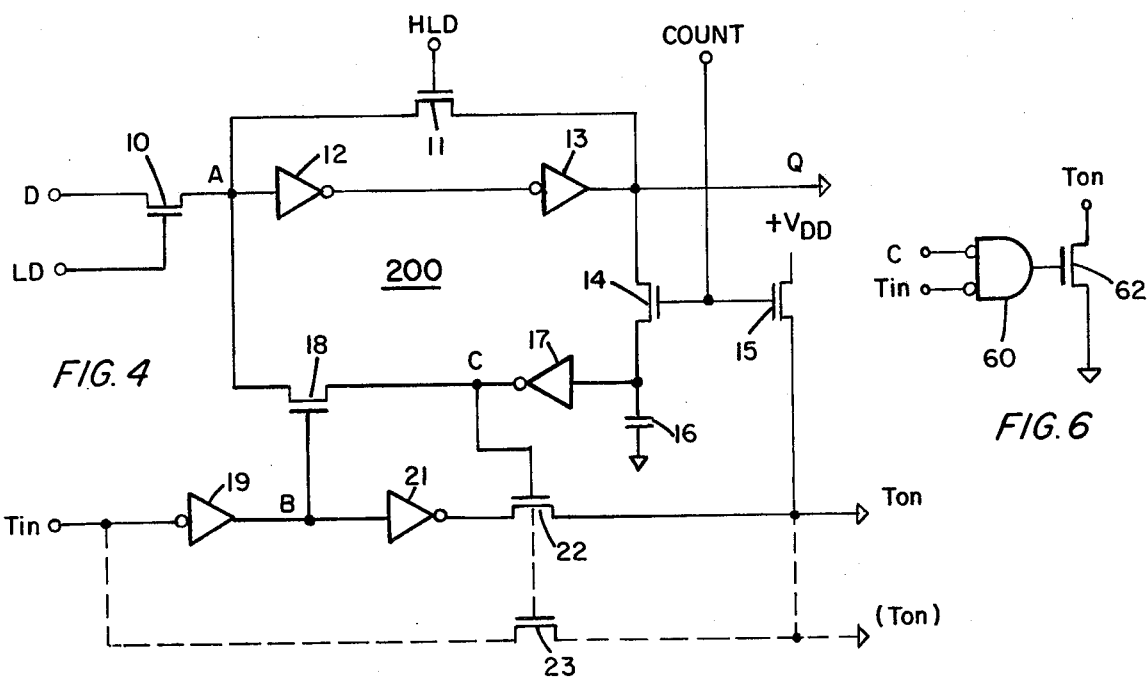
FIG. 4 is a schematic diagram of a decrementing counter cell.
Figure 5:
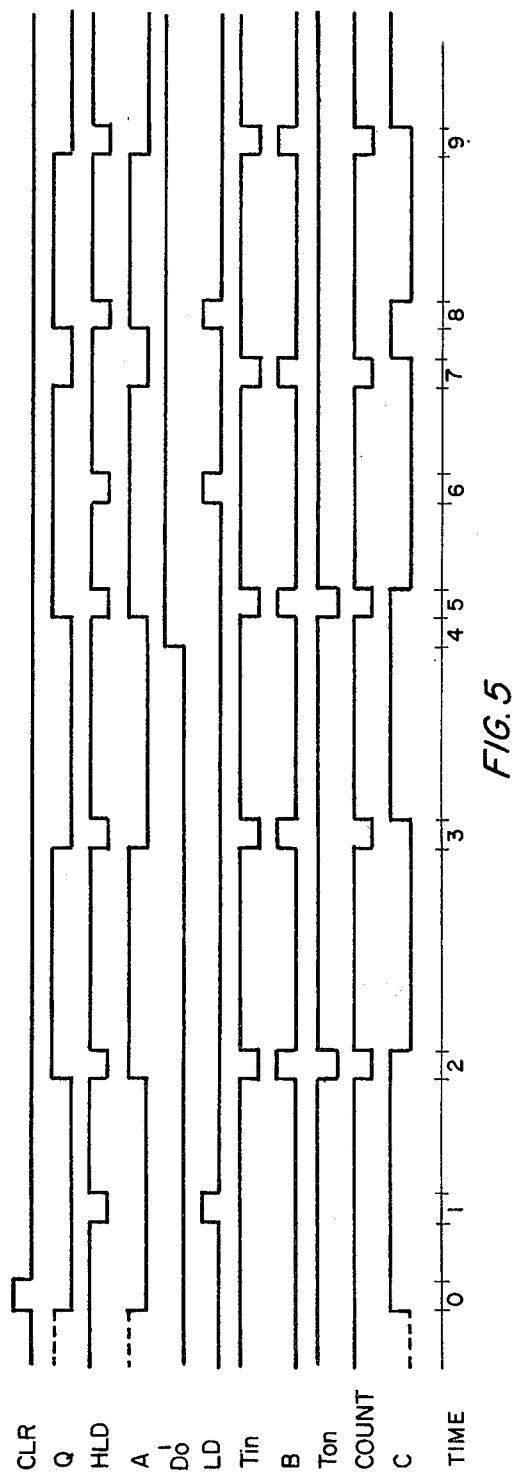
FIG. 5 is a timing diagram of the operation of the circuit shown in FIG. 4.

Referring now to FIG. 4, there is shown a schematic representation of a decrementer counter. It will be noted that the circuit is substantially similar to the circuit of the incrementer counter shown in FIG. 2 with the exception that inverter 20 has been omitted. For convenience, elements in FIG. 4 which are the same as the elements in FIG. 2 will bear similar reference numerals. The operation thereof is as shown in FIG. 5 and the similarities and dissimilarities thereof relative to FIGS. 2 and 3 are readily apparent.

Figure 6:
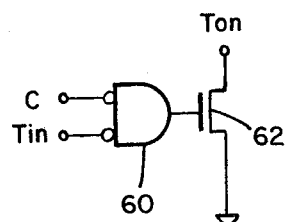
FIG. 6 is a schematic representation of an alternative circuit configuration detail.

Referring now to FIG. 6, there is shown another alternative circuit configuration which can be used in the case of a large load condition. In this case, NOR gate 60 is used in place of inverters 20 and 21 and transistor 22 (or 23). Thus, the input terminals of gate 60 are connected directly to the Tin terminal and node C. The output terminal of gate 60 is connected to the control electrode of gate 62. The conduction path of transistor 62 is connected between output terminal Ton and gorund (in this embodiment). This circuit configuration requires that both input signals supplied to gate 60 be logically true signals to activate transistor 62. When activated, transistor 62 connects terminal Ton to ground to produce a logical true (binary 1) signal at terminal Ton.

Thus, there are shown preferred embodiments of counter circuits. The circuits are capable of incrementing or decrementing operation. Also, heavy load capabilities are provided. The configurations shown and described are illustrative of the inventive concept. This configuration is quite suitable for implementation in MNOS techniques. It is clear that alternative details can be conceived by those skilled in the art. For example, the logic sense can be reversed. Also, details of individual components can be altered if desired. However, it must be understood that the above description is intended to be illustrative only and is not intended to be limitative. Rather, the scope of the invention is limited only by the scope of the claims appended hereto.

Having thus described a preferred embodiment of the invention, what is claimed is:

1. A counter circuit comprising,
   latch means for storing a count signal,
   control means connected from the output of said latch means to the input of said latch means to selectively transfer signals from said output to said input of said latch means for selectively altering the state of said latch means to thereby alter the count signal stored therein, and
   circuit means connected to said control means to selectively indicate the status of a carry signal in said counter circuit.

2. The counter circuit recited in claim 1 wherein,
   said latch means includes at least two inverting circits connected in cascade.

3. The counter circuit recited in claim 2 including,
   refresh feedback means connected from the output of said latch means to the input of said latch means to selectively refresh the signal stored in said latch means.

4. The counter circuit recited in claim 1 wherein,
   said control means includes switch means for selectively disconnecting said control means to prevent said transfer of signals.

5. The counter circuit recited in claim 4 wherein,
   said control means includes first inverter means connected in series with said switch means such that the signal transferred by said control means is inverted.

6. The counter circuit recited in claim 5 wherein,
   said control means includes second switch means connected to selectively transmit a carry signal in response to a signal from said control means.

7. The counter circuit recited in claim 6 wherein,
   said central means includes a plurality of inverter circuits in series with said switch means.

8. The counter circuit recited in claim 6 wherein,
   said control means includes second inverter means connected from said first invverter means to said second switch means.

9. The counter circuit recited in claim 7 wherein,
   said control means includes further switch means connected to one of said plurality of inverter means.

10. The counter circuit recited in claim 1 including,
    precharge control means connected to selectively supply a electrical charge signal the output of said counter circuit.

11. The counter circuit recited in claim 1 including,
    signal supplying means connected to said control means to control the operation thereof.

12. The counter circuit recited in claim 4 wherein,
    said switch means comprises a transistor.

13. The counter circuit recited in claim 5 including,
    charge storage means connected to the input of said inverter means.

14. The counter circuit recited in claim 3 including
    switch means connected to in parallel with said latch means to selectively interrupt said refresh feedback means.

* * * * *